(12) United States Patent
Ni

(10) Patent No.: US 12,262,592 B2
(45) Date of Patent: Mar. 25, 2025

(54) DISPLAY DEVICE WITH BENDING REGION HAVING LAYERS INCLUDING HIGH REFRACTIVE PARTICLES

(71) Applicant: Wuhan China Star Optoelectronics Semiconductor Display Technology Co., Ltd., Hubei (CN)

(72) Inventor: Jing Ni, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 862 days.

(21) Appl. No.: 17/275,202

(22) PCT Filed: Feb. 25, 2021

(86) PCT No.: PCT/CN2021/077833
§ 371 (c)(1),
(2) Date: Mar. 11, 2021

(87) PCT Pub. No.: WO2022/156035
PCT Pub. Date: Jul. 28, 2022

(65) Prior Publication Data
US 2023/0127038 A1    Apr. 27, 2023

(30) Foreign Application Priority Data
Jan. 21, 2021 (CN) .......................... 202110082017.6

(51) Int. Cl.
*H10K 59/122* (2023.01)
*H10K 50/844* (2023.01)
(Continued)

(52) U.S. Cl.
CPC ....... *H10K 59/122* (2023.02); *H10K 50/8445* (2023.02); *H10K 50/858* (2023.02);
(Continued)

(58) Field of Classification Search
CPC .. H10K 50/858; H10K 50/84; H10K 50/8445; H10K 59/122; H10K 59/87;
(Continued)

(56) References Cited

U.S. PATENT DOCUMENTS

| | | | |
|---|---|---|---|
| 2015/0001483 A1 | 1/2015 | Namkung | |
| 2021/0126056 A1* | 4/2021 | Kim | ........................ H10K 71/00 |
| 2022/0255044 A1* | 8/2022 | Kim | ..................... H10K 59/879 |

FOREIGN PATENT DOCUMENTS

| | | |
|---|---|---|
| CN | 110323264 | 10/2019 |
| CN | 110444679 | 11/2019 |

(Continued)

*Primary Examiner* — Marcos D. Pizarro

(57) ABSTRACT

A display panel and a display device are provided. The display panel includes a bending region and a non-bending region, and the bending region is distributed on a periphery of the non-bending region. The display panel further includes a first functional layer and a second functional layer disposed on a first encapsulation layer. The second functional layer is disposed in the bending region. A refractive index of the second functional layer is greater than a refractive index of the first functional layer. An embodiment of the present invention improves display effects of the display panel.

18 Claims, 3 Drawing Sheets

(51) Int. Cl.
*H10K 50/858* (2023.01)
*H10K 59/80* (2023.01)
*H10K 77/10* (2023.01)
*H10K 102/00* (2023.01)

(52) U.S. Cl.
CPC ....... *H10K 59/873* (2023.02); *H10K 59/8731* (2023.02); *H10K 59/879* (2023.02); *H10K 77/111* (2023.02); *H10K 59/877* (2023.02); *H10K 2102/311* (2023.02); *H10K 2102/331* (2023.02)

(58) Field of Classification Search
CPC ............. H10K 59/873; H10K 59/8731; H10K 59/879; H10K 77/111; H10K 2102/311; H10K 2102/331
See application file for complete search history.

(56) References Cited

FOREIGN PATENT DOCUMENTS

| | | |
|---|---|---|
| CN | 111668281 | 9/2020 |
| CN | 111755492 | 10/2020 |
| CN | 112002734 | 11/2020 |
| WO | WO 2020/246668 | 12/2020 |

\* cited by examiner

DISPLAY DEVICE WITH BENDING REGION HAVING LAYERS INCLUDING HIGH REFRACTIVE PARTICLES

RELATED APPLICATIONS

This application is a National Phase of PCT Patent Application No. PCT/CN2021/077833 having International filing date of Feb. 25, 2021, which claims the benefit of priority of Chinese Patent Application No. 202110082017.6 filed on Jan. 21, 2021. The contents of the above applications are all incorporated by reference as if fully set forth herein in their entirety.

FIELD AND BACKGROUND OF THE INVENTION

The present invention relates to the field of display technologies and in particular to a display panel and a display device.

With rapid development of wireless communication technologies, mobile phones have become more and more common in people's lives. In particular, mobile phones with curved screens are becoming more and more popular as new types of mobile phones. The mobile phones with curved screens, as the name suggests, means that they are different from traditional mobile phones with screens having flat features, and have a certain arc. Curved screens are made of materials that are not easily damaged, and they have small thicknesses, light weight, and low power consumption, and are more convenient to operate and more aesthetically pleasing.

However, a difficulty associated with the curved screens is that organic light-emitting diode (OLED) displays are affected by viewing angles, and display brightness of bending regions corresponding to edges of the curved screens is inconsistent with display brightness of non-bending regions corresponding to centers of the curved screens, which affects display effects of the curved screens.

How to improve display effects of curved screens is an urgent problem that needs to be solved in the field of current curved display technologies.

SUMMARY OF THE INVENTION

The present invention provides a display panel and a display device, aiming to solve a technical problem of how to improve display effects of curved screens.

On one hand, the present invention provides a display panel. The display panel comprises a bending region and a non-bending region, wherein the bending region is distributed on a periphery of the non-bending region. The display panel further comprises:
 a base substrate;
 an array functional layer disposed on the base substrate;
 a pixel definition layer disposed on the array functional layer;
 a light-emitting unit disposed in a pixel region provided on the pixel definition layer;
 a first encapsulation layer covering the light-emitting unit and the pixel definition layer;
 a first functional layer disposed on the first encapsulation layer, wherein the first functional layer is disposed in the non-bending region; and
 a second functional layer disposed on the first encapsulation layer, wherein the second functional layer is disposed in the bending region;
 wherein a refractive index of the second functional layer is greater than a refractive index of the first functional layer.

In a possible implementation of the present invention, the second functional layer comprises nanoparticles having a predetermined concentration.

In a possible implementation of the present invention, the predetermined concentration of the nanoparticles gradually increases along a direction away from the non-bending region.

In a possible implementation of the present invention, the second functional layer comprises at least one hole configured to improve a light extraction rate of the second functional layer.

In a possible implementation of the present invention, the second functional layer comprises a plurality of holes configured to improve a light extraction rate of the second functional layer, and sizes of the plurality of holes gradually decrease in a direction away from the non-bending region.

In a possible implementation of the present invention, the pixel definition layer comprises a plurality of first protrusions and a plurality of second protrusions, the plurality of first protrusions are disposed in the non-bending region, the plurality of second protrusions are disposed in the bending region, and a thickness of each of the second protrusions is greater than a thickness of each of the first protrusions.

In a possible implementation of the present invention, the thicknesses of all the second protrusions are same, or
 the thicknesses of the second protrusions gradually increase in a direction away from the non-bending region.

In a possible implementation of the present invention, the refractive index of the second functional layer in the bending region is same, or
 the refractive index of the second functional layer located between adjacent ones of the second protrusions gradually increases in a direction away from the non-bending region.

In a possible implementation of the present invention, the pixel definition layer comprises at least one third protrusion, the at least one third protrusion is located between the bending region and the non-bending region, and the at least one third protrusion separates the first functional layer from the second functional layer.

In a possible implementation of the present invention, the first encapsulation layer comprises at least one fourth protrusion, the at least one fourth protrusion is located between the bending region and the non-bending region, and the at least one fourth protrusion separates the first functional layer from the second functional layer.

In a possible implementation of the present invention, the display panel further comprises a second encapsulation layer covering the first encapsulation layer, the first functional layer, and the second functional layer.

On the other hand, the present invention provides a display device. The display device comprises a display panel. The display panel comprises a bending region and a non-bending region, wherein the bending region is distributed on a periphery of the non-bending region. The display panel further comprises:
 a base substrate;
 an array functional layer disposed on the base substrate;
 a pixel definition layer disposed on the array functional layer;
 a light-emitting unit disposed in a pixel region provided on the pixel definition layer;
 a first encapsulation layer covering the light-emitting unit and the pixel definition layer;

a first functional layer disposed on the first encapsulation layer, wherein the first functional layer is disposed in the non-bending region; and a second functional layer disposed on the first encapsulation layer, wherein the second functional layer is disposed in the bending region;

wherein a refractive index of the second functional layer is greater than a refractive index of the first functional layer.

In a possible implementation of the present invention, the second functional layer comprises nanoparticles having a predetermined concentration.

In a possible implementation of the present invention, the predetermined concentration of the nanoparticles gradually increases along a direction away from the non-bending region.

In a possible implementation of the present invention, the second functional layer comprises at least one hole configured to improve a light extraction rate of the second functional layer.

In a possible implementation of the present invention, the second functional layer comprises a plurality of holes configured to improve a light extraction rate of the second functional layer, and sizes of the plurality of holes gradually decrease in a direction away from the non-bending region.

In a possible implementation of the present invention, the pixel definition layer comprises a plurality of first protrusions and a plurality of second protrusions, the plurality of first protrusions are disposed in the non-bending region, the plurality of second protrusions are disposed in the bending region, and a thickness of each of the second protrusions is greater than a thickness of each of the first protrusions.

In a possible implementation of the present invention, the thicknesses of all the second protrusions are same, or the thicknesses of the second protrusions gradually increase in a direction away from the non-bending region.

In a possible implementation of the present invention, the refractive index of the second functional layer in the bending region is same, or the refractive index of the second functional layer located between adjacent ones of the second protrusions gradually increases in a direction away from the non-bending region.

In a possible implementation of the present invention, the pixel definition layer comprises at least one third protrusion, the at least one third protrusion is located between the bending region and the non-bending region, and the at least one third protrusion separates the first functional layer from the second functional layer.

Beneficial Effect

A display panel provided by the present invention comprises a bending region and a non-bending region. The bending region is distributed on a periphery of the non-bending region, and the bending region is bent in a direction away from the display panel. The display panel further comprises a base substrate; an array functional layer disposed on the base substrate; a pixel definition layer disposed on the array functional layer; a light-emitting unit disposed in a pixel region provided on the pixel definition layer; a first encapsulation layer covering the light-emitting unit and the pixel definition layer; a first functional layer disposed on the first encapsulation layer, wherein the first functional layer is disposed in the non-bending region; and a second functional layer disposed on the first encapsulation layer, wherein the second functional layer is disposed in the bending region; wherein a refractive index of the second functional layer is greater than a refractive index of the first functional layer. The present invention adjusts the refractive index of the second functional layer in the above-mentioned display panel to be greater than the refractive index of the first functional layer. Therefore, the light extraction rate of the bending region corresponding to the second functional layer is increased to reduce a difference of light output effects between the bending region and the non-bending region, so that users receive same brightness in the bending region and non-bending region, thereby improving display effects of the display panel.

BRIEF DESCRIPTION OF THE SEVERAL VIEWS OF THE DRAWINGS

In order to illustrate technical solutions in embodiments of the present invention more clearly, following will briefly introduce drawings needed in descriptions of the embodiments. Obviously, the drawings in the following description are only some of the embodiments of the present invention, and those skilled in the art can obtain other drawings according to the drawings without any creative work.

DESCRIPTION OF SPECIFIC EMBODIMENTS OF THE INVENTION

The following will clearly and completely describe technical solutions in embodiments of the present invention with reference to drawings in the embodiments of the present invention. Obviously, the described embodiments are only a part of the embodiments of the present invention, rather than all the embodiments. Based on the embodiments in the present invention, all other embodiments obtained by those skilled in the art without creative work are within the protection scope of the present invention.

Embodiments of the present invention provide a display panel and a display device. The display panel comprises a bending region and a non-bending region. The bending region is distributed on a periphery of the non-bending region, and the bending region is bent in a direction away from the display panel. The display panel comprises a base substrate; an array functional layer disposed on the base substrate; a pixel definition layer disposed on the array functional layer; a light-emitting unit disposed in a pixel region provided on the pixel definition layer; a first encapsulation layer covering the light-emitting unit and the pixel definition layer; a first functional layer disposed on the first encapsulation layer, wherein the first functional layer is disposed in the non-bending region; and a second functional layer disposed on the first encapsulation layer, wherein the second functional layer is disposed in the bending region. A refractive index of the second functional layer is greater than a refractive index of the first functional layer. Detailed descriptions are given below.

Figure 1:
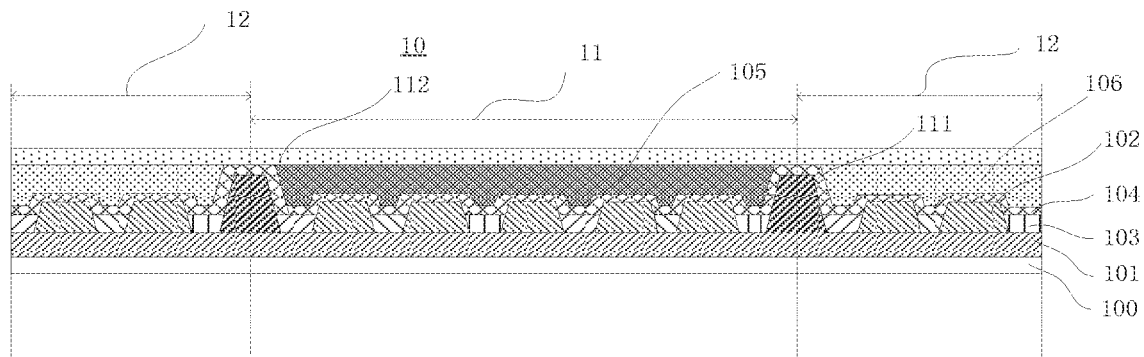
FIG. 1 is a schematic structural view of an embodiment of a cross-section of a display panel in an embodiment of the present invention.
Figure 2:
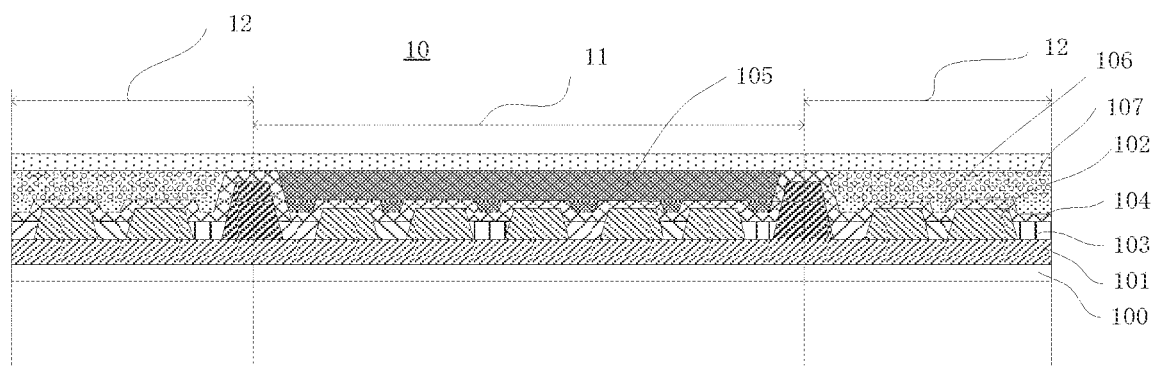
FIG. 2 is a schematic structural view of another embodiment of the display panel in the embodiment of the present invention.
Figure 3:
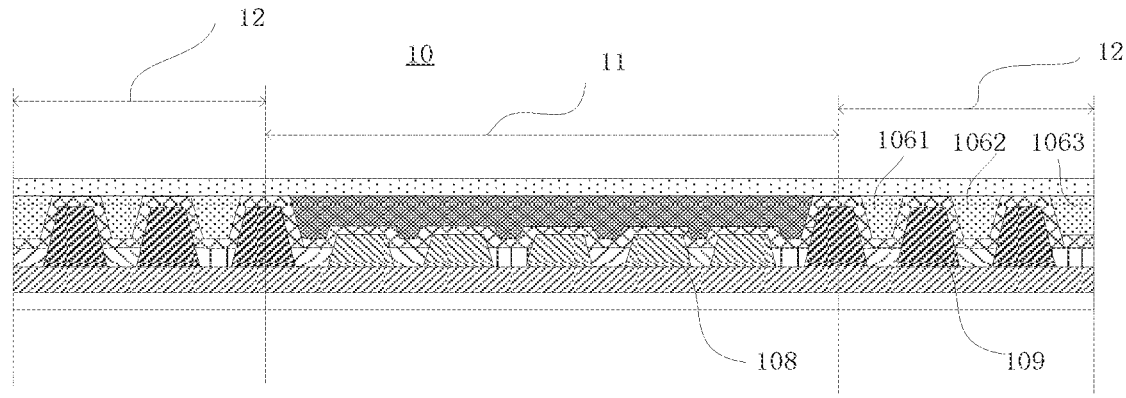
FIG. 3 is a schematic structural view of another embodiment of the display panel in the embodiment of the present invention.
Figure 4:
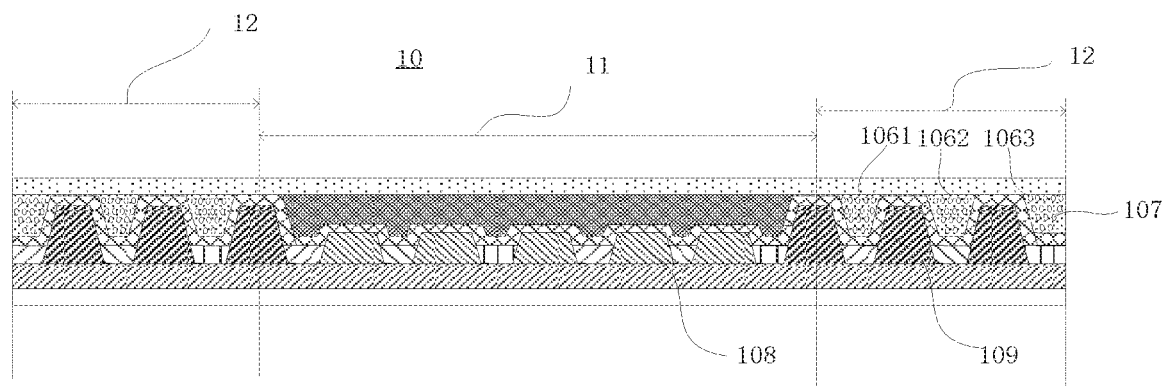
FIG. 4 is a schematic structural view of another embodiment of the display panel in the embodiment of the present invention.
Figure 5:
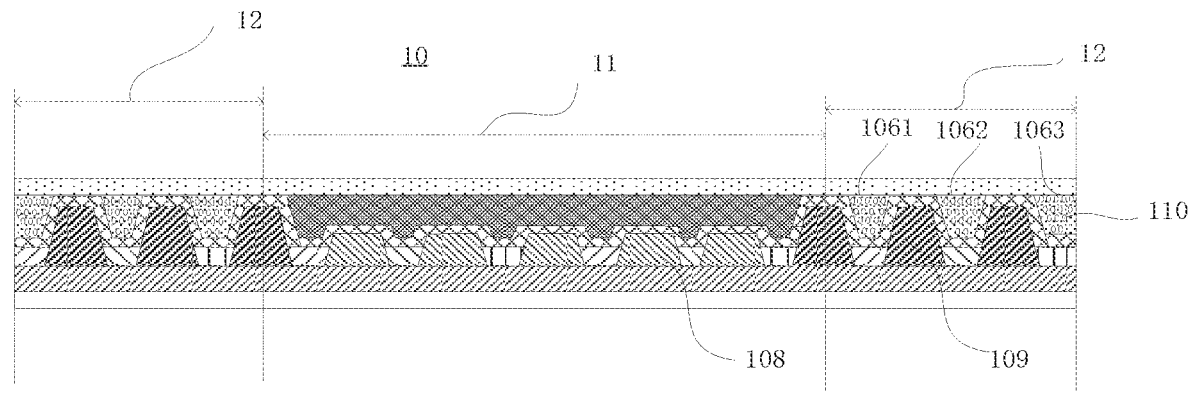
FIG. 5 is a schematic structural view of another embodiment of the display panel in the embodiment of the present invention.

Please refer to FIG. 1 to FIG. 5. FIG. 1 is a schematic structural view of an embodiment of a cross-section of a display panel in an embodiment of the present invention. FIG. 2 is a schematic structural view of another embodiment of the display panel in the embodiment of the present invention. FIG. 3 is a schematic structural view of another embodiment of the display panel in the embodiment of the present invention. FIG. 4 is a schematic structural view of another embodiment of the display panel in the embodiment of the present invention. FIG. 5 is a schematic structural view of another embodiment of the display panel in the embodiment of the present invention.

In the embodiment of the present invention, the display panel 10 comprises a bending region 12 and a non-bending region 11. The bending region is distributed on a periphery of the non-bending region, and the bending region is bent in a direction away from the display panel. The display panel comprises a base substrate 100; an array functional layer 101 disposed on the base substrate 100; a pixel definition layer 102 disposed on the array functional layer 101; a light-emitting unit 103 disposed in a pixel region provided on the pixel definition layer 102; a first encapsulation layer 104 covering the light-emitting unit 103 and the pixel definition layer 102; a first functional layer 105 disposed on the first encapsulation layer 104, wherein the first functional layer 105 is disposed in the non-bending region 11; and a second functional layer 106 disposed on the first encapsulation layer 104, wherein the second functional layer 106 is disposed in the bending region 12. A refractive index of the second functional layer 106 is greater than a refractive index of the first functional layer 105.

It should be noted that the display panel 10 can be used in electronic devices such as mobile phones and computers. A shape of the display panel 10 corresponding to these types of devices is generally rectangular. Therefore, edges of the rectangular display panel 10 generally refer to four straight sides of the rectangle. A display direction of the display panel 10 is generally upward. For example, when a user is using an electronic device having the display panel 10, a direction of the display panel 10 towards the user's face is generally its display direction, and a display direction away from the display panel 10 is generally opposite to the display direction. Specifically, the four straight sides of the display panel 10 may be bent on one side to form the bending region 12 on one side, or may be bent on multiple sides to form the bending regions 12 on opposite sides. Specifically, bending shapes or bending degrees of the bending regions 12 on two opposite sides may be same or different.

It should be further explained that the bending regions 12 on both sides are shown in FIG. 1 of the present invention, which is only an example. It may have only one bending region. Since FIG. 1 is a schematic structural view of the embodiment of the cross-section of the display panel 10, structures on the other two sides cannot be observed, and the other two sides may also be bending structures. In addition, in order to illustrate a structural relationship in FIG. 1 of the present invention, the bending region 12 is not illustrated for bending. In addition, the higher the refractive index of the second functional layer 106, the better the refraction effect on emitted light along a user's viewing angles. Therefore, special attention is needed to distinguish a difference between a refractive index and a refraction effect. In the embodiment of the present invention, since a specific structure of the display panel 10 corresponds to a light propagation direction, the refraction effect described in the present invention increases as the refractive index decreases within a certain range.

Wherein, the array functional layer 101 generally may comprise structures such as a buffer layer, a gate, a gate insulating layer, a metal electrode, a pixel electrode, and an interlayer insulating layer. The base substrate 100 is generally made of a flexible material, and the flexible material may be, but is not limited to, polyimide, and it may also be other flexible materials. The light-emitting unit 103 generally corresponds to an R/G/B pixel matrix, which comprises a plurality of R/G/B sub-pixels. The first encapsulation layer 104 may be an inorganic encapsulation layer, the first functional layer 105 may be an organic encapsulation layer, and the second functional layer 106 may be an anti-reflection organic layer. The refractive index of the second functional layer 106 is different from the refractive index of the first functional layer 105. Specifically, a material of the second functional layer 106 may be an acrylic material. The refractive index of the second functional layer 106 ranges from 1.50 to 1.70, and the refractive index of the first functional layer 105 ranges from 1.48 to 1.52. It should be noted that, in the present invention, a display difference between the bending region 12 and the non-bending region 11 is reduced by selecting the material of the second functional layer 106 of the bending region 12 to have a refractive index greater than the refractive index of the first functional layer of the non-bending region 11. An implementation solution is a relative size relationship of the refractive indexes corresponding to the first functional layer 105 and the second functional layer 106. Although ranges of the refractive indexes of the two overlap, a prerequisite for selection is that the refractive index of the second functional layer 106 is greater than the refractive index of the first functional layer 105. The second functional layer 106 can be formed by inkjet printing (IJP), silk screen printing, or dot coating. The pixel definition layer 102 located in the bending region 12 and the pixel definition layer 102 located in the non-bending region 11 can be same material or different materials. For example, both are organic materials. Similarly, the pixel definition layer 102 located in the bending region 12 and the pixel definition layer 102 located in the non-bending region 11 can be a single-layer structure or a double-layer structure. Specifically, a film can be deposited by coating or inkjet printing. The display panel 10 may be an OLED display panel 10.

The display panel 10 provided by the present invention comprises the bending region 12 and the non-bending region 11. The bending region 12 is distributed on the periphery of the display panel 10, and the bending region 12 is bent in the display direction away from the display panel 10. The display panel 10 comprises the base substrate 100; the array functional layer 101 disposed on the base substrate 100; the pixel definition layer 102 disposed on the array functional layer 101; the light-emitting unit 103 disposed on the pixel definition layer 102; the first encapsulation layer 104 covering the light-emitting unit 103 and the pixel definition layer 102; the first functional layer 105 disposed on the first encapsulation layer 104, wherein the first functional layer 105 is disposed in the non-bending region 11; and the second functional layer 106 disposed on the first encapsulation layer 104, wherein the second functional layer 106 is disposed in the bending region 12. The refractive index of the second functional layer 106 is greater than the refractive index of the first functional layer 105. The present invention adjusts the refractive index of the second functional layer 106 in the above-mentioned display panel 10 to be greater than the refractive index of the first functional layer 105. Therefore, the light extraction rate of the bending region 12 corresponding to the second functional layer 106 is increased to reduce a difference in a light output effect of the bending region 12 and the non-bending region 11, so that users receive same brightness in the bending region 12 and non-bending region 11, thereby improving display effects of the display panel 10.

In the description of the present invention, it needs to be understood that the terms "center," "longitudinal," "lateral," "length," "width," "thickness," "upper," "lower," "front," "rear," "left," "right," "vertical," "horizontal," "top," "bottom," "inner," "outer," "clockwise," "counterclockwise," etc. are used in the orientations and positional relationships indicated in the drawings for convenience in describing the present invention and for simplicity in description, and are not intended to indicate or imply that the referenced devices or elements must have a particular orientation, be constructed in a particular orientation, and be operated in a particular manner, and are not to be construed as limiting the present invention. Furthermore, the terms "first" and "second" are used for descriptive purposes only and are not to be construed as indicating or implying relative importance or implicitly indicating the number of technical features indicated. Thus, features defined as "first", "second", may explicitly or implicitly include one or more of the described features. In the description of the present application, "plurality" means two or more unless specifically limited otherwise.

As shown in FIG. 1, in the embodiment of the present invention, the pixel definition layer 102 comprises at least one third protrusion 111. The at least one third protrusion is located between the bending region 12 and the non-bending region 11, and the at least one third protrusion separates the first functional layer 105 from the second functional layer 106.

As shown in combination with FIG. 1 and FIG. 2, in the embodiment of the present invention, the second functional layer 106 comprises nanoparticles 107 having a predetermined concentration. The predetermined concentration is a concentration range within a certain range. Specifically, the concentration can be adjusted according to actual needs, which is not limited here. The nanoparticles can be inorganic materials such as ZnO2, CrO2, TiO2, etc., or organic materials with certain scattering functions and transparency, which are not limited as long as they meet functional requirements. The nanoparticles can be formed by inkjet, dot coating, etc. A size of the nanoparticles ranges from 1 nm to 200 nm. The embodiment of the present invention further increases the refractive index of the second functional layer 106 by adding the nanoparticles to the second functional layer 106. Therefore, the light extraction rate of the bending region corresponding to the second functional layer 106 is increased to reduce the difference in the light output effect of the bending region and the non-bending region, so that the users receive same brightness in the bending region and non-bending region, thereby improving display effects of the display panel.

It should be noted that FIG. 2 comprises two bending regions 12 on left and right, and each of the two bending regions 12 are provided with the nanoparticles having the predetermined concentration. In addition, the nanoparticles having the predetermined concentration can be set in only one bending region 12. Specific settings can be adjusted according to actual needs. Furthermore, since FIG. 2 is a longitudinal cross-sectional view, upper and lower sides of the structure relative to a top view of FIG. 2 cannot be seen. In practical applications, a corresponding region on the upper side can also be formed as the bending region as required, and a corresponding region on the lower side can also be formed as the bending region as required.

With reference to FIG. 1 and FIG. 3, in the embodiment of the present invention, the pixel definition layer 102 comprises a plurality of first protrusions 108 and a plurality of second protrusions 109. The plurality of first protrusions are disposed in the non-bending region 11, the plurality of second protrusions are disposed in the bending region 12, and a thickness of each of the second protrusions is greater than a thickness of each of the first protrusions. Due to a problem of a bending angle in the bending region 12, the bending angle of the bending region 12 in a direction away from the non-bending region 11 becomes larger, and its display effects correspondingly worsen. Therefore, in order to improve an overall display effect of the bending region 12, the bending region 12 can also be partitioned. As shown in FIG. 3, the plurality of second protrusions can divide the second functional layer 106 into a plurality of first sub-functional layers 1061, second sub-functional layers 1062, and third sub-functional layers 1063. Refractive indexes of the first sub-functional layers 1061, the second sub-functional layers 1062, and the third sub-functional layers 1063 increase in order. Specifically, it can be realized by filling them with materials of different refractive indexes. For example, filling acrylic materials in the second functional layer 106, and adjusting the refractive indexes in the first sub-functional layers 1061, the second sub-functional layers 1062, and the third sub-functional layers 1063. As a result, a problem of uneven display caused by the bending angle of the bending region 12 becoming greater in the direction away from the non-bending region 11 is solved, and the display effects of the display panel is further improved.

With reference to FIG. 1 to FIG. 2, in the embodiment of the present invention, the predetermined concentration of the nanoparticles gradually increases along the direction away from the non-bending region 11. Due to the problem of the bending angle in the bending region 12, the bending angle of the bending region 12 away from the non-bending region 11 becomes larger, and its display effects correspondingly worsen. Therefore, in order to improve the overall display effect of the bending region 12, the concentration of nanoparticles along the direction away from the non-bending region 11 can also be gradually increased.

With reference to FIG. 3 and FIG. 4, in the embodiment of the present invention, the concentration of the nanoparticles gradually increases in the direction away from the non-bending region 11. Due to the problem of the bending angle in the bending region 12, the bending angle of the bending region 12 in the direction away from the non-bending region 11 becomes larger, and its display effects correspondingly worsen. Therefore, in order to improve the overall display effect of the bending region 12, the bending region 12 can also be partitioned. The plurality of second protrusions can divide the second functional layer 106 into the plurality of first sub-functional layers 1061, the second sub-functional layers 1062, and the third sub-functional layers 1063. Add the nanoparticles to the first sub-functional layers 1061, the second sub-functional layers 1062, and the third sub-functional layers 1063, and the refractive indexes of the first sub-functional layers 1061, the second sub-functional layers 1062, and the third sub-functional layers 1063 increase in order. In this way, the concentration of nanoparticles gradually increases in the direction away from the non-bending region 11, so that the bending region 12 closer to the edge has a greater refraction effect on light. As a result, the problem of uneven display caused by the bending angle of the bending region 12 becoming greater in the direction away from the non-bending region 11 is solved, and display effects of the display panel are further improved.

As shown in FIG. 5, in the embodiment of the present invention, the second functional layer 106 comprises at least one hole 110 configured to improve a light extraction rate of the second functional layer 106. A diameter of the hole ranges from 1 nm to 200 nm. Specifically, a hole of a target size can be selected according to actual needs. In the embodiment of the present invention, by providing at least one hole in the second functional layer 106, the refractive index of the second functional layer 106 is further increased, the light extraction effect of the bending region 12 is improved, display uniformity between the bending region 12 and the non-bending region 11 is realized, and the display effects are improved.

As shown in FIG. 5, in the embodiment of the present invention, the second functional layer 106 comprises a plurality of holes. Sizes of the plurality of holes gradually decrease in the direction away from the non-bending region 11. Due to the problem of the bending angle in the bending region 12, the bending angle of the bending region 12 in the direction away from the non-bending region 11 becomes larger, and its display effects correspondingly worsen. Therefore, in order to improve the overall display effect of the bending region 12, the bending region 12 can also be partitioned. The plurality of second protrusions can divide the second functional layer 106 into the plurality of first sub-functional layers 1061, the second sub-functional layers 1062, and the third sub-functional layers 1063. Add the holes to the first sub-functional layers 1061, the second sub-functional layers 1062, and the third sub-functional layers 1063, and the sizes of the holes in the first sub-functional layers 1061, the second sub-functional layers 1062, and the third sub-functional layers 1063 decrease in order. In this way, the holes gradually decrease in the direction away from the non-bending region 11, so that the bending region 12 closer to the edge has a greater refraction effect on light. As a result, the problem of uneven display caused by the bending angle of the bending region 12 becoming greater in the direction away from the non-bending region 11 is solved, and the display effects of the display panel are further improved.

In the embodiment of the present invention, the first encapsulation layer 104 comprises at least one fourth protrusion. The at least one fourth protrusion is located between the bending region 12 and the non-bending region 11, and the at least one fourth protrusion separates the first functional layer 105 from the second functional layer 106.

In the embodiment of the present invention, the refractive index of each of the regions in the second functional layer 106 is different, and the refractive index of each of the regions gradually increases along the direction away from the non-bending region 11.

As shown in FIG. 1, in the embodiment of the present invention, the display panel 10 further comprises a second encapsulation layer 112. The second encapsulation layer covers the first encapsulation layer 104, the first functional layer 105, and the second functional layer 106.

Figure 6:
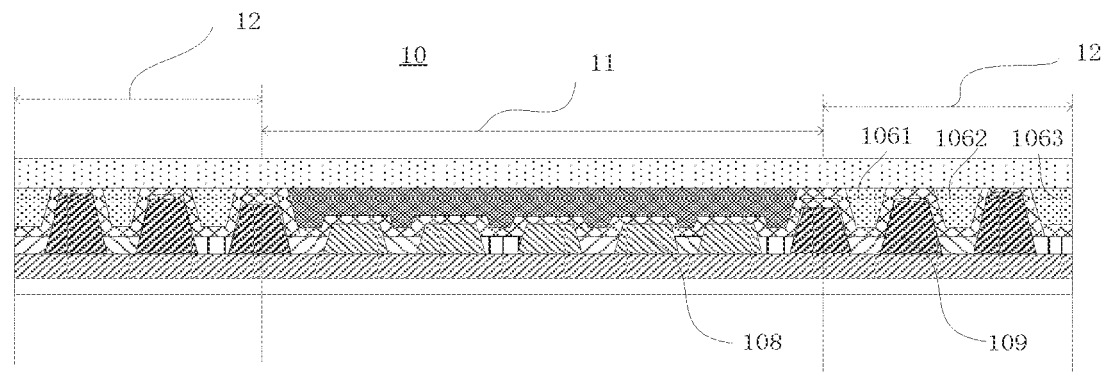
FIG. 6 is a schematic structural view of another embodiment of the display panel in the embodiment of the present invention.

As shown in FIG. 6. FIG. 6 is a schematic structural view of another embodiment of the display panel in the embodiment of the present invention.

In the embodiment of the present invention, the thicknesses of all the second protrusions 109 are same, or
the thicknesses of the second protrusions 109 gradually increase in the direction away from the non-bending region 11.

In the embodiment of the present invention, the refractive index of the second functional layer 106 in the bending region 12 is same, or
the refractive index of the second functional layer 106 located between adjacent ones of the second protrusions 109 gradually increases in the direction away from the non-bending region 11.

In the present invention, the term "exemplary" is used to mean "used as an example, illustration, or explanation." Any embodiment described as "exemplary" in the present invention is not necessarily to be construed as more preferred or advantageous than other embodiments. In order to enable any person skilled in the art to implement and use the present invention, the following description is given. In the following description, the invention sets out details for the purpose of explanation. It should be understood that those of ordinary skill in the art may recognize that the present invention can be implemented even without using these specific details. In other examples, well-known structures and processes will not be elaborated in detail to avoid unnecessary details that obscure the description of the present invention. Therefore, the present invention is not intended to be limited to the illustrated embodiments but should be consistent with the widest scope consistent with the principles and features disclosed in the present invention.

In order to better implement the display panel 10 in the embodiment of the present invention, based on the above-mentioned display panel 10, the embodiment of the present invention further provides a display device, which comprises the above-mentioned display panel 10.

The display panel 10 provided by the present invention comprises the bending region 12 and the non-bending region 11. The bending region 12 is distributed on the periphery of the display panel 10, and the bending region 12 is bent in the display direction away from the display panel 10. The display panel 10 comprises the base substrate 100; the array functional layer 101 disposed on the base substrate 100; the pixel definition layer 102 disposed on the array functional layer 101; the light-emitting unit 103 disposed on the pixel definition layer 102; the first encapsulation layer 104 covering the light-emitting unit 103 and the pixel definition layer 102; the first functional layer 105 disposed on the first encapsulation layer 104, wherein the first functional layer 105 is disposed in the non-bending region 11; and the second functional layer 106 disposed on the first encapsulation layer 104, wherein the second functional layer 106 is disposed in the bending region 12. The refractive index of the second functional layer 106 is greater than the refractive index of the first functional layer 105. The present invention adjusts the refractive index of the second functional layer 106 in the above-mentioned display panel 10 to be greater than the refractive index of the first functional layer 105. Therefore, the light extraction rate of the bending region 12 corresponding to the second functional layer 106 is increased to reduce the difference in the light output effect of the bending region 12 and the non-bending region 11, so that the users receive same brightness in the bending region 12 and non-bending region 11, thereby improving the display effects of the display panel 10.

The above describes the display panel 10 and the display device provided by the embodiments of the present invention in detail. The article uses specific examples to explain principles and implementation of the present invention. The descriptions of the above embodiments are only used to help understand technical solutions and core ideas of the present invention. At the same time, for those skilled in the art, according to the idea of the present invention, there will be changes in the specific implementation and application scope. In summary, the content of the specification should not be construed as a limitation on the present invention.

What is claimed is:

1. A display panel, comprising:
   a bending region and a non-bending region, wherein the bending region is distributed on a periphery of the non-bending region;
   a base substrate;
   an array functional layer disposed on the base substrate;
   a pixel definition layer disposed on the array functional layer;
   a light-emitting unit disposed in a pixel region provided on the pixel definition layer;
   a first encapsulation layer covering the light-emitting unit and the pixel definition layer;
   a first functional layer disposed on the first encapsulation layer, wherein the first functional layer is disposed in the non-bending region; and
   a second functional layer disposed on the first encapsulation layer, wherein the second functional layer is disposed in the bending region;
   wherein a refractive index of the second functional layer is greater than a refractive index of the first functional layer, and
   wherein the pixel definition layer comprises a plurality of first protrusions and a plurality of second protrusions, the plurality of first protrusions are disposed in the non-bending region, the plurality of second protrusions are disposed in the bending region, and a thickness of each of the second protrusions is greater than a thickness of each of the first protrusions.

2. The display panel as claimed in claim 1, wherein the second functional layer comprises at least one hole configured to improve a light extraction rate of the second functional layer.

3. The display panel as claimed in claim 1, wherein the second functional layer comprises a plurality of holes configured to improve a light extraction rate of the second functional layer, and sizes of the plurality of holes gradually decrease in a direction away from the non-bending region.

4. The display panel as claimed in claim 1, wherein the thicknesses of all the second protrusions are same, or
   the thicknesses of the second protrusions gradually increase in a direction away from the non-bending region.

5. The display panel as claimed in claim 1, wherein the refractive index of the second functional layer in the bending region is same, or
   the refractive index of the second functional layer located between adjacent ones of the second protrusions gradually increases in a direction away from the non-bending region.

6. The display panel as claimed in claim 1, wherein the pixel definition layer comprises at least one third protrusion, the at least one third protrusion is located between the bending region and the non-bending region, and the at least one third protrusion separates the first functional layer from the second functional layer.

7. The display panel as claimed in claim 1, wherein the first encapsulation layer comprises at least one fourth protrusion, the at least one fourth protrusion is located between the bending region and the non-bending region, and the at least one fourth protrusion separates the first functional layer from the second functional layer.

8. The display panel as claimed in claim 1, further comprising a second encapsulation layer covering the first encapsulation layer, the first functional layer, and the second functional layer.

9. The display panel as claimed in claim 1, wherein the second functional layer comprises nanoparticles having a predetermined concentration.

10. The display panel as claimed in claim 9, wherein the predetermined concentration of the nanoparticles gradually increases along a direction away from the non-bending region.

11. A display device, comprising:
    a display panel, wherein the display panel comprises:
       a bending region and a non-bending region, wherein the bending region is distributed on a periphery of the non-bending region;
       a base substrate;
       an array functional layer disposed on the base substrate;
       a pixel definition layer disposed on the array functional layer;
       a light-emitting unit disposed in a pixel region provided on the pixel definition layer;
       a first encapsulation layer covering the light-emitting unit and the pixel definition layer;
       a first functional layer disposed on the first encapsulation layer, wherein the first functional layer is disposed in the non-bending region; and
       a second functional layer disposed on the first encapsulation layer, wherein the second functional layer is disposed in the bending region;
    wherein a refractive index of the second functional layer is greater than a refractive index of the first functional layer, and
    wherein the pixel definition layer comprises at least one third protrusion, the at least one third protrusion is located between the bending region and the non-bending region, and the at least one third protrusion separates the first functional layer from the second functional layer.

12. The display device as claimed in claim 11, wherein the second functional layer comprises at least one hole configured to improve a light extraction rate of the second functional layer.

13. The display device as claimed in claim 11, wherein the second functional layer comprises a plurality of holes configured to improve a light extraction rate of the second functional layer, and sizes of the plurality of holes gradually decrease in a direction away from the non-bending region.

14. The display device as claimed in claim 11, wherein the second functional layer comprises nanoparticles having a predetermined concentration.

15. The display device as claimed in claim 14, wherein the predetermined concentration of the nanoparticles gradually increases along a direction away from the non-bending region.

16. The display device as claimed in claim 11, wherein the pixel definition layer comprises a plurality of first protrusions and a plurality of second protrusions, the plurality of first protrusions are disposed in the non-bending region, the plurality of second protrusions are disposed in the bending region, and a thickness of each of the second protrusions is greater than a thickness of each of the first protrusions.

17. The display device as claimed in claim 16, wherein the thicknesses of all the second protrusions are same, or the thicknesses of the second protrusions gradually increase in a direction away from the non-bending region.

18. The display device as claimed in claim 16, wherein the refractive index of the second functional layer in the bending region is same, or the refractive index of the second functional layer located between adjacent ones of the second protrusions gradually increases in a direction away from the non-bending region.

* * * * *